Figure 1:
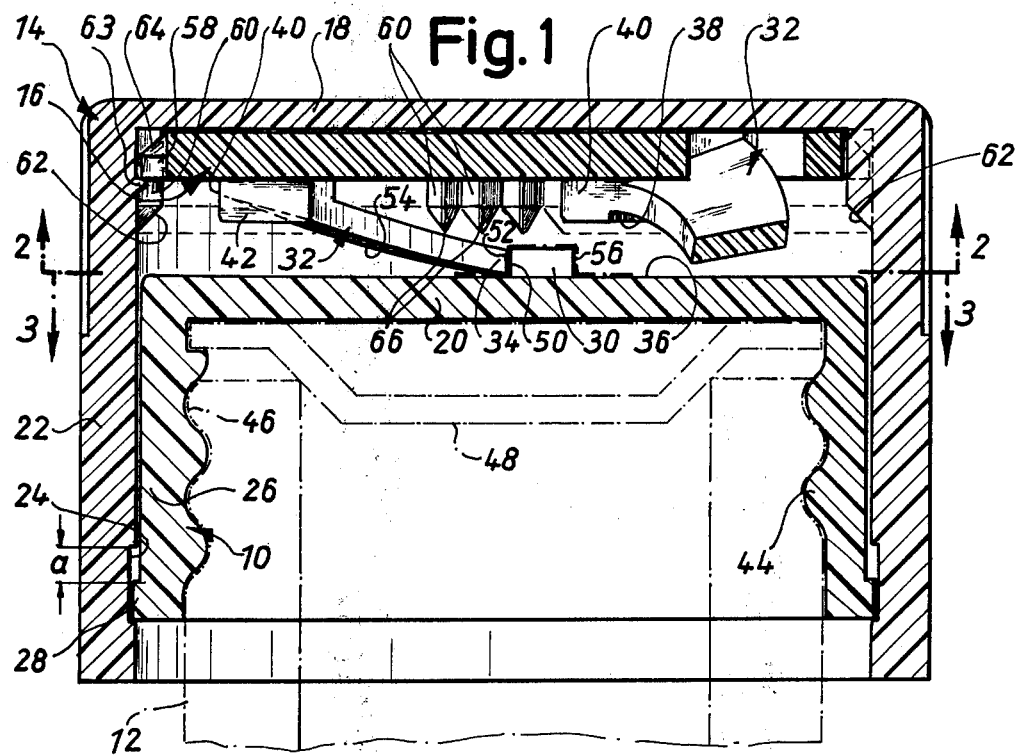

United States Patent [19]
Grau

[11] 3,972,436
[45] Aug. 3, 1976

[54] SAFETY CLOSURE CAP
[76] Inventor: Hermann Grau, 7070 Schwab.-Gmund-Lindach, Lammleweg 8, Germany
[22] Filed: Dec. 2, 1975
[21] Appl. No.: 637,082

[30] Foreign Application Priority Data
Dec. 13, 1974 Germany............................ 2459030

[52] U.S. Cl. ............................................... 215/220
[51] Int. Cl.²................... B65D 55/02; B65D 85/56; A61J 1/00
[58] Field of Search................................ 215/9, 220

[56] References Cited
UNITED STATES PATENTS
3,394,829   7/1968   Peterson............................. 215/220
3,857,505   12/1974  Mumford et al..................... 215/220

Primary Examiner—George T. Hall
Attorney, Agent, or Firm—Olsen and Stephenson

[57] ABSTRACT

A safety closure cap having a first closure member and a second closure member rotatably retained therein. The second closure member may be screwably attached to a container, so that the cap closes the container by rotation of the first closure member in the closing direction, the two closure members being coupled together for this purpose. For removing the cap from the container the cap is provided with a further coupling arrangement which can be engaged when the two closure members are moved together, rotation of the first closure member in a direction opposite to the closing direction causing simultaneous screwable rotation of the second closure member from the container.

6 Claims, 3 Drawing Figures

SAFETY CLOSURE CAP

The invention relates to safety closure caps for containers, especially for chemical and pharmaceutical vials.

Known safety closure caps comprise an outside cap member as a first and an inside cap member overlapped thereby as a second closure member, which can be fixed to the container or released therefrom by rotating the outside cap member. At least one resilient tongue is connected with one of the closure members and maintains the outside cap member axially spaced from the inside cap member, and forms a constituent part of a one-way coupling for automatically coupling the two closure members when the outside cap member is turned in a closing sense, the one-way coupling containing at least one stop against which an edge of the resilient tongue abuts in one sense of rotation of the outside cap member, and over which the tongue slides in the other sense of rotation, as well as a coupling for opening the safety cap which is actuable by moving the two closure members towards each other against the action of the resilient tongue.

A safety closure cap of the type described at the outset is already disclosed in German Auslegeschrift 2,115,741. In this construction the tongues, forming a constituent part of the one-way coupling provided between the two closure members, are formed on the outside of the base of the inner cap that is injection moulded with plastics, and have to transmit to the inner cap the torque acting on the outside cap for closing the container in question. Since in this case the tongues must, on the one hand, possess sufficient elasticity, in order to be able to pass with their free resilient ends over the stops formed on the inside of the base of the outside cap and coacting with them when closing the container, and, on the other, comparatively great strength for transmitting the torque needed for closing the container and for standing up to the consequent pressure stress and for resisting the bending and creasing arising from their oblique position, the tongues must be made with suitable and correspondingly expensive plastics materials, namely thermoplastics based on formaldehyde (acetal resins).

Due to the fact that the tongues are integral with the inside cap, the latter must also be made from the same material, although it may otherwise be injection moulded with cheap plastics. Consequently, the production costs of such known safety caps are predominently determined by the comparatively large amount of expensive acetal resin required to produce the inside cap or second closure member. A further substantial drawback stems from the integral form of the inside cap and tongues, since producing the inside cap requires an injection mould which is equipped with mould plungers movable radially in relation to the longitudinal axis of the inside cap for moulding the tongues, owing to the necessity of forming the base of the inside cap closed to ensure a tight container closure.

The unavoidable combination of the injection mould with such moulding plungers, therefore, allows the corresponding plunger tools to be made with only two and at most four mould clusters. The output of such tools is correspondingly small.

Finally, it has hitherto been possible to mould only two tongues on inside caps, especially when these have a comparatively small diameter, for reasons of space required by the ineluctable moulding plungers.

The present invention provides an improved safety closure cap of the type described which makes it possible to produce the inside cap member, like the outside cap member, from a cheaper plastics material, e.g. polypropylene, polystyrene, polyethylene or duroplast, and in an injection mould without plungers.

This is made possible by providing at least one resilient tongue on a disc placed between the closure members, the disc being non-rotatably secured to one of the closure members. In this way the tongue is provided on a structural part separate from either of the closure members, so that only the disc alone need be made from the expensive acetal resin, for which only a fraction of the amount of the expensive material used for producing the inside cap is required.

According to the invention therefore there is provided a safety closure cap for containers comprising an outside cap member as a first and an inside cap member enclosed within the outside cap member, as a second closure member, the inside cap member being adapted to be fastened to the container or released therefrom by rotating the outside cap member, at least one resilient tongue couple to one of the closure members for maintaining the outside cap member axially spaced from the inside cap member, and forming a part of a one-way coupling for automatically coupling the two closure members to move together when the outside cap is turned in a closing sense to fasten the inside cap member to the container, the one-way coupling having at least one stop against which an edge of the resilient tongue abuts in one direction of rotation of the outside cap member, and over which the tongue slides in the other direction of rotation of the outside cap member, and a coupling for opening the closure cap which is engageable by moving the two closure members towards each other against the action of the resilient, tongue, characterized in that the root of each resilient tongue is provided on a disc mounted between the closure members, the disc being non-rotatably coupled to one of the closure members.

The invention leads to a considerable reduction in costs. Thus the inside cap member may be formed as a normal screw-on cap, on the outside of whose base only suitable stops are formed against which the tongue is able to bear for screwing on the inside cap. It is, therefore, possible to provide the injection mould with 30 or more mould clusters. It is similarly possible by arranging the tongue on a disc separate from the closure members to achieve a considerable advantageous effect from the point of view of technical production, inasmuch as mould plungers for forming the tongue can henceforth be completely dispensed with, nor need tight closure be a consideration any longer as when the tongues are formed on the inside cap, and thus the injection mould serving for the production of such discs can likewise be equipped with a correspondingly large number of mould clusters.

The production of tongues without plungers makes for ready reproducibility and easier adjustability of the properties and design of the tongues (i.e., strength, thrust, angle, bias).

Consequently, the invention also enables the production of suitable safety closures to be considerably increased, as well as construction of injection moulds that are less liable to failure and cheaper to produce.

A further substantial advantage of the invention lies in that the one-way coupling may now easily have two or more tongues, since no mould plungers are required for their production, which has previously claimed much room in the moulding works. A softer, more uniform axial force can be achieved by equipping a one-way coupling with three or more tongues. A further advantage in this connection arises from the fact that the angle of rotation in securing the coupling can also be reduced in this way. Moreover, it is now possible so to form the disc as to make it applicable to closure parts differing in size or shape. It will also be particularly noticed that a tipping effect in large threads or large closure members can be eliminated by providing the disc with several tongues. If several tongues were formed on the inside cap of the conventional safety closure, this would mean providing a plunger in the tool for every tongue, which would greatly increase the price of the tool. On the contrary, with the solution according to the invention any desired number of tongues in the safety closure can be provided practically without additional cost. The invention enables an additional sealing lip or edge to be formed if desired on the inside cap, and these parts can be moulded from a plastics material that sets particularly soft.

The state of the art already includes a safety cap (U.S. Patent Specification 3,394,829) between whose two members there is also provided a disc on which several resilient tongues are formed and bear against a closure member. In this known closure design, however, the tongues of the disc have only the purpose of lifting the outer closure member off the inner closure member to ensure that the coupling always stays open for opening the closure, making it quite impossible for a child to open the safety closure. In contrast the tongues provided on the disc in the safety closure according to the invention fulfill a double purpose, in that they act, analagously to the prior design, as spacers for the two closure members, on the one hand, and for a constituent part of the one-way coupling for closing the safety closure, on the other.

So far as the safety cap according to the invention is concerned, the mounting of the disc between the two closure members in a definite position can be simply effected by its being non-rotatably held in an inner peripheral part of one of the two closure members, securing against rotation being achieved, for instance, by gluing. A non-rotatable retention of the disc may also be obtained by suitably dimensioning its outside diameter and the inside diameter of the peripheral part receiving the disc, with a pressure fit and/or at least one snap point. In a preferred form of embodiment the disc is provided with teeth around its perimeter which positively engage without play corresponding inner teeth formed upon a peripheral inner part of the corresponding closure member. In this case it is of advantage if both sets of teeth, when the disc is mounted, are forwardly chamfered at the mutually opposite ends and at least those of the corresponding closure member are formed pointed at contact. In this case the two sets of teeth adjust themselves automatically so that it is possible to mount the disc in the corresponding peripheral part of the closure member by machine by letting the disc drop fully automatically into the inner peripheral part and then pressing it into the same, the disc being self-retained in the receiving inner teeth owing to the suitable design of the two sets of teeth. To facilitate further the automatic assembly of the inside cap, the disc may be lightly held by being slightly screwed in on the mould core for the inner fashioning of the outside cap. Once the inside cap has been assembled, the disc can no longer be axially shifted out of the teeth against the pressure exerted by the tongues. The toothed system presents the additional advantage that the disc can be mounted in the inner peripheral part in any desired position. It is advantageous, however, to provide the disc at the base of the ouutside cap, and so to form the inner teeth on its inner perimeter.

Figure 2:
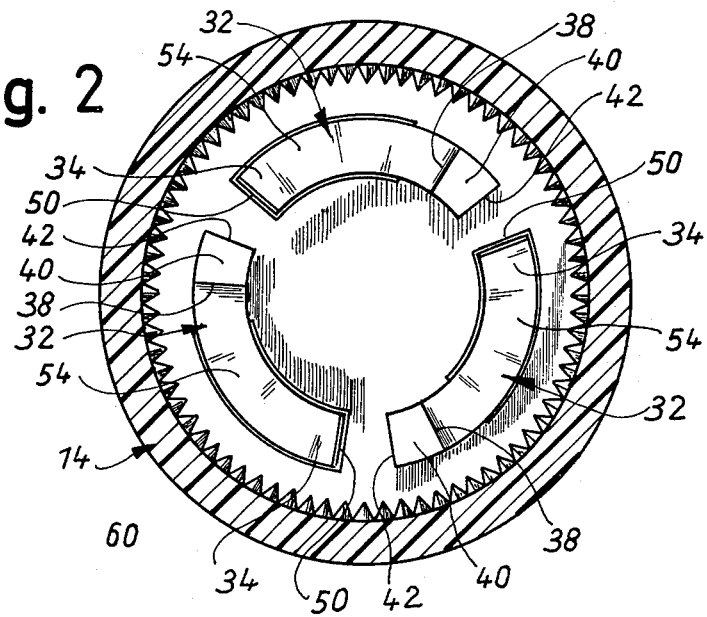
Figure 3:
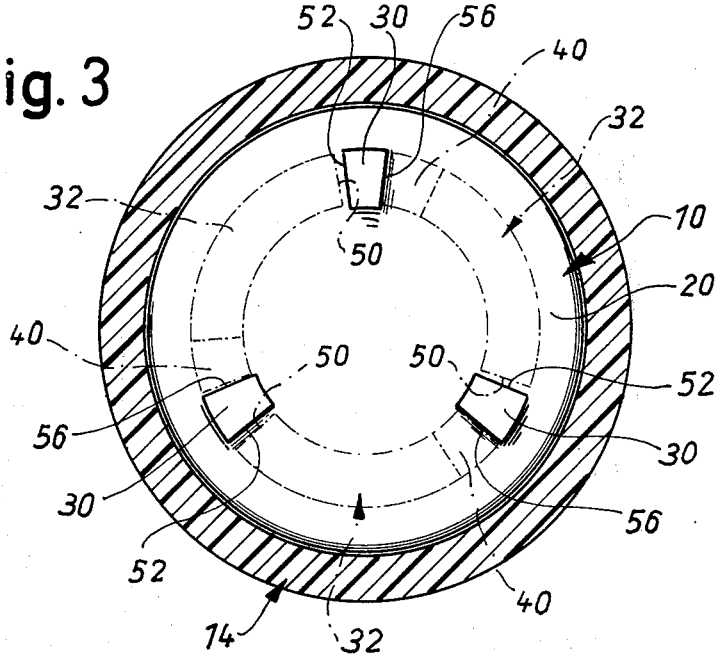

The invention will now be described by way of example with reference to the accompanying drawings wherein:

FIG. 1 a longitudinal section through a safety closure;

FIG. 2 a cross section along the line 2—2 in FIG. 1 of an outside cap of the safety closure;

FIG. 3 a cross section of the outside cap of the safety closure along the line 3—3 of FIG. 1.

The safety cap shown in the drawings comprises an inside cap member 10 which is gripped by an outside cap member 14, and screwed on a neck 12 of a pharmaceutical vial which is shown in dash-and-dot lines. These two caps jointly with a disc 16, which is mounted in the interspace between the base 18 of the outside cap member 14 and the base 20 of the inside cap member 10, form the safety cap. The inner and outside cap members are rotatable relative to each other, and can be axially moved relatively to each other by a predetermined axial distance 'a', in that the outside cap member 14 has upon the inside of its perimeter wall 22 a circumferential groove 24 into which a collar 28, formed on the outside of the perimeter walls 26 of the inside cap member 10, fits the width of the groove being greater than that of the collar. The circumferential collar 28 is easily fitted into the outside cap member 14 when the safety closure is being assembled, or the inside cap member 10 fitted into the outside cap member 14, by slightly widening the latter, the collar 28 snapping into the groove 24 automatically. The safety cap is formed of a first coupling, being a one-way coupling, for closing the pharmaceutical vial or for screwing the inside cap member 10 on the neck of the vial, and a second coupling for opening the pharmaceutical vial. One half of both couplings consists of the elements of the disc 16, which is non-rotatably mounted on the inside of the base 18 of the outside cap member 14. The other half of both couplings consists of abutment cams 30, formed on the outside of the base 20 of the inside cap 10 in angular spacing, there being provided three abutment cams in the present embodiment which coact with both the half-coupling of the first and the half-coupling of the second coupling.

The elements forming the half of the first coupling, formed as a one-way coupling for closing the vial, consist of segmental tongues 32, which are angularly equispaced and formed concentric about the centre of the disc 16 upon its lower face according to FIG. 1, and which bear with pretensioning with their free portions 34 against the outer face 36 of the base 20 of the inside cap member 10. The graduated circle on which these tongues are located contains the abutment cams 30. The mutual spacing of the tongues 32, or the distance of the free tongue portion 34 from a respective tongue root 38 and an adjacent tongue 32 is a little larger than the width of the abutment cams 30 (see FIG. 3). As coupling elements of the second coupling for screwing on the safety closure, the disc 16 is provided with cams 40, which are moulded at the roots 38 of the tongues 32 and can be brought into contact via their free head surface 42 with the corresponding adjacent surface of the abutment cam 30. For screwing the safety closure on and off the inside cap member 10 has an inner thread 44 by which it can be screwed on or off an outside thread 46 of the vial neck. A sealing cap 48, cork disc or similar sealing inset, made as a plastics casting, is self-retained inside the inner cap member 10.

In order to screw the safety closure upon the vial neck for closing the pharmaceutical vial, the outer cap member 14, as seen from above, is turned clockwise. Thus the free end portions 34 of the tongues 32 engage edges 50 of the abutment faces 52 of the cams 30 and in this way transmit the torque acting upon the outside cap 14 to the inside cap 10. The inside cap member 10 is thereby entrained in the screwing-on direction and can be fixed fast on the bottleneck for sealing closure. The tongues 32 keep the outside cap member 14 permanently spaced from the inside cap member 10 so that the cams 40, formed at the roots of the tongues and constituting the coupling elements of the coupling that serves for opening the safety closure, are held in a plane lying above the abutment cams 30. This ensures that children unaware of the functioning of the safety closure, are unable to open it. If the outside cap member 14 is turned counterclockwise the tongues 32, due to their resilience, will run up with their flat bottom side 54, which forms a ramp, the abutment cams 30 and be deflected upwards, so that their free ends 34 pass over the abutment cams 30 without transmitting a torque to them, and, having passed them, again snap down with a clearly audible click.

The opening of the safety cap, on the other hand, cannot be affected until the axial force generated by the tongues 32 and so by the elements of one half of the one-way coupling and operative between the two closure members has been overcome, whereby the cams 40 formed at the roots of the tongues are brought into such a plane that when the outside cap 14 is turned counterclockwise their abutment surfaces 42 are brought up against the corresponding counter-surfaces 56 of the abutment cams 30. Consequently the outside cap member 14 must be pressed down against the action of the resilient tongues and towards the inside cap member 10 before being rotated counterclockwise for opening the vial. The disc 16 with the tongues 32 and cams 40 may be mounted on the outer head surface of the inside cap member 10 so that the tongues bear against the inner head surface of the base 18 of the outside cap member, the abutment cams 30 being formed in this case on the base 18. The tongues 32 must possess good elastic properties and high strength in order, on the one hand, to keep the outside cap member 14 in a permanently upraised position over the inside cap member 10, and, on the other, to be able to transmit the torque exerted on the outside cap member for closing the bottle, to the inside cap member, and it should be realized that with the usual smallness of such safety caps the thickness of the tongues 32 usually is barely one millimeter. The requisite elasticity and strength of the tongues can be achieved in these circumstances only by means of a top quality and correspondingly expensive plastics material. Acetal resin is a material especially suitable for this purpose. Since the tongues are moulded on the relatively thin plastic disc 16, which serves as a carrier, the cost of this expensive plastics material can be kept to a minimum as compared with the conventional closure cap design described at the outset, where the tongues are formed directly on the outside of the base of the inside cap, so that the whole of the inside cap must inevitably be injection-moulded from the same expensive plastic. The construction according to the invention thus makes it possible to make both the outside and the inside cap of the same cheap plastics, for instance, polypropylene, polystyrene, polyethylene or a duroplast.

As has already been described above, the disc 16 is mounted on the base of the outside cap member 14. This affords a simple mode of assembly whereby the disc may be inserted with its flat upper face into the outside cap member. In order to make this possible without recourse to additional aids, the disc is provided along its perimeter with circumferential teeth 58, which are associated on the inside of the perimeter walls 22 of the cover cap 14 with an inner set of teeth 60, the outer teeth of the disc interlocking with the latter positively and without play. In this way the disc 16 can be axially secured against rotation in any arbitrary position relatively to the outside cap 14, once the teeth are so coordinated that their sides bear against each other under suitable pressure in the inserted condition of the disc. Additionally to secure the disc, toothed cams 63 are formed at preselected points on the inside perimeter of the cover cap, and more exactly between the teeth of the inner set of teeth 60, so that the disc can be supported thereon. The toothed systems are so designed that the disc is seated more or less firmly in the outside cap when it has been pressed into the inner set of teeth. In order to facilitate the interengagement of the toothed systems, the teeth in both systems are forwardly chamfered at their head ends which face each other in mounting the disc, as indicated at 62 and 64 in FIG. 1. In addition, at least the teeth of the inner set of teeth 60 of the outside cap are frontally pointed at their free ends. This is shown at 66 in FIG. 1, and it may here be mentioned that only three teeth of the circumferential inner tooth system 60 are illustrated for the sake of clarity. The described design of the teeth in both tooth systems enables the disc 16 to be mounted by machine in the outside cap 14, and thus a wholly automatic assembly of the entire safety closure is achieved.

I claim:

1. A safety closure cap for containers comprising first closure means, second closure means rotatably retained within said first closure means and for screwable attachment to a container, a disc member disposed between and coupled to one of said first and second closure means, said disc having at least one resilient tongue for maintaining the first and second closure means axially spaced from one another and forming part of a one-way coupling for automatically coupling the first and second closure means to move together in one direction of rotation of said first closure means for closing a container, the one-way coupling having a stop coupled to the other one of said first and second closure means, said resilient tongue having an edge portion for abutting against said stop in said one direction of rotation of said first closure means and over which the tongue slides in the other direction of rotation of said first closure means, and a coupling to permit the closure cap to be opened the coupling being engagable by moving said first and second closure means towards each other against the action of the resilient tongue.

2. A safety closure cap according to claim 1 wherein said first closure means is provided with an inner peripheral part for non-rotatably retaining said disc therein.

3. A safety closure cap as claimed in claim 2 wherein in the surface of the inner peripheral part enclosing the disc there is provided at least one projection for axially securing the disc.

4. A safety closure cap according to claim 3, wherein the disc is provided with teeth on its perimeter which positively engange an inner toothed system formed on the inner peripheral part of the corresponding closure member, said projection being provided on the surface of the inner peripheral part and between adjacent teeth of the inner toothed system.

5. A safety closure cap according to claim 4, wherein the teeth on the disc and on the inner toothed system are forwardly chamfered at their leading edges, and at least the teeth of the inner toothed system have pointed free ends.

6. A safety closure cap according to claim 5 wherein the disc is mounted in the base of the outside cap member.

\* \* \* \* \*